(12) United States Patent
Yushio et al.

(10) Patent No.: US 6,271,163 B1
(45) Date of Patent: Aug. 7, 2001

(54) ALUMINUM NITRIDE SINTERED BODY AND METHOD OF PREPARING THE SAME

(75) Inventors: Yasuhisa Yushio; Hirohiko Nakata; Kazutaka Sasaki; Masuhiro Natsuhara; Motoyuki Tanaka, all of Itami; Yasuhiro Murase, Osaka, all of (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/357,600

(22) Filed: Jul. 20, 1999

(30) Foreign Application Priority Data

Jul. 22, 1998 (JP) .................................................. 10-206353

(51) Int. Cl.[7] .................................................. C04B 35/581
(52) U.S. Cl. .............................................................. 501/98.5
(58) Field of Search .............................................. 501/98.5

(56) References Cited

U.S. PATENT DOCUMENTS

| | | |
|---|---|---|
| 4,578,232 | 3/1986 | Huseby et al. . |
| 4,578,233 | 3/1986 | Huseby et al. . |
| 4,578,234 | 3/1986 | Huseby et al. . |
| 4,578,364 | 3/1986 | Huseby et al. . |
| 4,578,365 | 3/1986 | Huseby et al. . |
| 4,746,637 * | 5/1988 | Kasori et al. ........................... 501/98 |
| 4,770,953 * | 9/1988 | Horiguchi et al. ................... 428/698 |
| 5,034,357 | 7/1991 | Yamakawa et al. . |
| 5,077,245 * | 12/1991 | Miyahara ................................ 501/96 |
| 5,085,923 | 2/1992 | Yamakawa et al. . |
| 5,154,863 | 10/1992 | Miyahara et al. . |
| 5,312,786 * | 5/1994 | Yamakawa et al. ................. 501/98.4 |
| 5,314,850 * | 5/1994 | Miyahara ................................ 501/96 |
| 5,482,903 * | 1/1996 | Duncombe et al. .................... 501/32 |

FOREIGN PATENT DOCUMENTS

| | | |
|---|---|---|
| 0180724 | 5/1986 | (EP) . |
| 0330848 | 8/1994 | (EP) . |
| 0235682 | 9/1997 | (EP) . |
| 58-55377 | 4/1983 | (JP) . |
| 61-117160 | 6/1986 | (JP) . |
| 63-190761 | 8/1988 | (JP) . |
| 63-277570 | 11/1988 | (JP) . |
| 5-76795 | 10/1993 | (JP) . |
| 7-5372 | 1/1995 | (JP) . |
| 7-5373 | 1/1995 | (JP) . |
| 7-5374 | 1/1995 | (JP) . |
| 7-5375 | 1/1995 | (JP) . |
| 7-5376 | 1/1995 | (JP) . |
| 407094645 * | 4/1995 | (JP) . |
| 7-38491 | 4/1995 | (JP) . |
| 9-012370 * | 1/1997 | (JP) . |

* cited by examiner

*Primary Examiner*—Karl Group
(74) *Attorney, Agent, or Firm*—W. F. Fasse; W. G. Fasse

(57) ABSTRACT

An aluminum nitride sintered body has excellent thermal shock resistance and strength, and is applicable to a radiating substrate for a power module or a jig for semiconductor equipment employed under a strict heat cycle. The aluminum nitride sintered body contains 0.01 to 5 percent by weight of an alkaline earth metal element compound in terms of an oxide and 0.01 to 10 percent by weight of a rare earth element compound in terms of an oxide, respectively as sintering aids, and a residual amount of carbon in a range from 0.005 to 0.1 percent by weight, thereby suppressing grain growth and improving thermal shock resistance and strength of the sintered body.

18 Claims, No Drawings

ALUMINUM NITRIDE SINTERED BODY AND METHOD OF PREPARING THE SAME

BACKGROUND OF THE INVENTION

1. Field of the Invention

The present invention relates to an aluminum nitride sintered body, and more particularly, it relates to an aluminum nitride sintered body allowing low-temperature sintering and having high strength and high thermal conductivity. The invention further relates to a method of preparing the same.

2. Description of the Prior Art

Aluminum nitride (AlN) having high thermal conductivity and a low thermal expansion coefficient is recently employed as the material for insulated substrates for various types of electronic components, in place of alumina which has been employed in general.

In general, however, aluminum nitride has a relatively high sintering temperature of at least 1800° C. An existing sintering furnace or jig component cannot sufficiently withstand such a high temperature but must be frequently repaired or discarded/exchanged. Further, aluminum nitride sintered at a high temperature requires high sintering energy. Therefore, the cost for an aluminum nitride sintered body is higher than that for an alumina sintered body, to which hinders popularization of aluminum nitride.

In order to sinter aluminum nitride which is generally hard to sinter as compared with alumina, a sintering aid of an alkaline earth metal element compound or a rare earth element compound is mainly employed. Particularly in order to lower the sintering temperature, more specifically to enable sintering at a temperature of not more than 1700° C., combined use of an alkaline earth metal element compound and a rare earth element compound is studied. Typically, various studies have been made on sintering aids prepared by combining calcium compounds and yttrium compounds.

For example, Japanese Patent Laying-Open No. 61-117160 (1986) describes an aluminum nitride sintered body obtained by normal pressure sintering under a temperature of not more than 1700° C. with a sintering aid prepared by combining an alkaline earth metal element compound such as $CaCO_3$ and a rare earth element compound such as $La_2O_3$. Japanese Patent Laying-Open No. 63-190761 (1988) describes a sintering aid for aluminum nitride prepared by combining CaO and $Y_2O_3$.

A technique of reducing an aluminum oxide contained in a sintered body with carbon or a material liberating carbon for improving the thermal conductivity of an aluminum nitride sintered body is generally known. For example, each of Japanese Patent Publication Nos. 7-5372 to 7-5376 (1995) discloses a method of increasing the thermal conductivity of aluminum nitride by nitriding an oxide contained therein through free carbon with a sintering aid of an yttrium compound. Further, Japanese Patent Laying-Open No. 58-55377 (1983) describes a method of reducing/removing oxygen by employing an alkaline metal compound as a sintering aid and adding carbon powder or the like.

In addition, it is known that a thick metallized film having high strength can be formed by introducing a rare earth element or an alkaline earth metal element into an aluminum nitride sintered body. For example, Japanese Patent Publication No. 5-76795 (1993) discloses a circuit board obtained by forming a conductor part or a dielectric part prepared from at least either paste containing Ag or paste containing Au on an aluminum nitride sintered body containing at least one element selected from a rare earth element and an alkaline earth metal element. Japanese Patent Publication No. 7-38491 (1995) describes a method of forming a conductive layer of a high melting point metal such as tungsten or molybdenum on an aluminum nitride sintered body containing at least one element selected from a rare earth element and an alkaline earth metal element.

As described above, sintering of aluminum nitride under a low temperature of not more than 1700° C. has been enabled due to development of a new sintering aid prepared by combining an alkaline earth metal element compound and a rare earth element compound. Thus, the thermal conductivity of an aluminum nitride sintered body is improved, and such an aluminum nitride sintered body is increasingly applied to a substrate for an exothermic semiconductor element such as a power device.

In the aforementioned method employing the sintering aid of a rare earth element and/or an alkaline earth metal element, however, a rare earth aluminum oxide, an alkaline earth aluminum oxide, a rare earth alkaline earth aluminum oxide and the like are formed between an oxide present in the aluminum nitride sintered body and the sintering aid. Although formation of these oxides is necessary for the aforementioned low-temperature sintering under a temperature of not more than 1700° C., the grain sizes of the sintered body are increased due to the oxides.

In recent years, aluminum nitride is frequently applied to a radiating substrate for a power module or a jig for semiconductor equipment, which is used under a strict heat cycle. Therefore, aluminum nitride must be improved in thermal shock resistance as well as strength for serving as ceramic. In this regard, the mean grain size of the aluminum nitride sintered body must be not more than 3 $\mu$m, preferably not more than 2 $\mu$m. In the conventional method, however, further improvement of the strength of the sintered body cannot be attained due to increase of the grain sizes resulting from formation of a large amount of oxides.

SUMMARY OF THE INVENTION

In consideration of such general circumstances, an object of the present invention is to provide an aluminum nitride sintered body excellent in thermal shock resistance and strength and applicable to a radiating substrate for a power module or a jig for semiconductor equipment used under a strict heat cycle by suppressing grain growth in the case of employing a rare earth element and an alkaline earth metal element as materials for a sintering aid and a method of preparing the same.

In order to attain the aforementioned object, the inventors have deeply studied this matter to find that grain growth can be suppressed and thermal shock resistance and strength of an aluminum nitride sintered body can be remarkably improved even if employing a sintering aid containing a rare earth element and an alkaline earth metal element by properly selecting the amounts of blending thereof and controlling the amount of carbon remaining in the sintered body, to propose the present invention.

The aluminum nitride sintered body according to the present invention contains at least 0.005 percent by weight and not more than 0.1 percent by weight of carbon, at least 0.01 percent by weight and not more than 5 percent by weight of an alkaline earth metal element in terms of an oxide thereof and at least 0.01 percent by weight and not more than 10 percent by weight of a rare earth element in terms of an oxide thereof with a rest mainly composed of aluminum nitride.

Preferably, the alkaline earth metal element includes at least one element selected from a group consisting of Ca, Sr and Ba.

Preferably, the rare earth element includes at least one element selected from a group consisting of Y, La, Ce, Sc, Yb, Nd, Er and Sm.

Preferably, the mean grain size of aluminum nitride grains forming the sintered body is not more than 3 μm.

Preferably, the aluminum nitride sintered body further comprises a conductive layer or an insulating layer formed on a surface thereof by a thick film paste method.

A method of preparing an aluminum nitride sintered body according to an aspect of the present invention comprises steps of preparing mixed powder containing at least 0.01 percent by weight and not more than 2 percent by weight of carbon powder, at least 0.01 percent by weight and not more than 5 percent by weight of an alkaline earth metal element in terms of an oxide thereof and at least 0.01 percent by weight and not more than 10 percent by weight of a rare earth element in terms of an oxide thereof with a remainder or rest being mainly composed of powder of aluminum nitride, forming a compact with the mixed powder, and forming a sintered body by sintering the compact.

Preferably, the content of carbon in the compact at a temperature of 1500° C. is at least 0.01 percent by weight and not more than 0.1 percent by weight in the sintering process.

Preferably, the sintering temperature is not more than 1700° C.

Preferably, the mean grain size of the powder of aluminum nitride is at least 0.5 μm and not more than 2.0 μm.

Preferably, the content of oxygen in the powder of aluminum nitride is at least 0.8 percent by weight and not more than 1.5 percent by weight with respect to the weight of the aluminum nitride powder.

A method of preparing an aluminum nitride sintered body according to another aspect of the present invention comprises steps of preparing mixed powder containing at least 0.01 percent by weight and not more than 20 percent by weight of a compound liberating carbon, at least 0.01 percent by weight and not more than 5 percent by weight of an alkaline earth metal element in terms of an oxide thereof and at least 0.01 percent by weight and not more than 10 percent by weight of a rare earth element in terms of an oxide thereof with a rest mainly composed of powder of aluminum nitride, forming a compact with the mixed powder, liberating carbon by heat-treating the compact in a non-oxidizing atmosphere under a condition of at least 150° C. and not more than 1500° C. in temperature, and forming a sintered body by sintering the heat-treated compact.

Preferably, the compound liberating carbon includes at least one compound selected from a group consisting of polyacrylonitrile, polyvinyl alcohol, polyvinyl butyral, polyethylene terephthalate, glucose, fructose, saccharose, phenol-formaldehyde resin and stearic acid.

Preferably, the content of carbon in the compact at a temperature of 1500° C. is at least 0.01 percent by weight and not more than 0.1 percent by weight in the sintering process.

Preferably, the sintering temperature is not more than 1700° C.

Preferably, the mean grain size of the powder of aluminum nitride is at least 0.5 μm and not more than 2.0 μm.

Preferably, the content of oxygen in the powder of aluminum nitride is at least 0.8 percent by weight and not more than 1.5 percent by weight with respect to the weight of the aluminum nitride powder.

A method of preparing an aluminum nitride sintered body according to still another aspect of the present invention comprises steps of preparing mixed powder containing at least 0.01 percent by weight and not more than 5 percent by weight of an alkaline earth metal element in terms of an oxide thereof and at least 0.01 percent by weight and not more than 10 percent by weight of a rare earth element in terms of an oxide thereof with a rest mainly composed of powder of aluminum nitride, forming a compact with the mixed powder, and forming a sintered body by sintering the compact in a non-oxidizing atmosphere having a content of at least 10 percent by volume and not more than 100 percent by volume of at least one of carbon monoxide and hydrocarbon.

Preferably, the content of carbon in the compact at a temperature of 1500° C. is at least 0.01 percent by weight and not more than 0.1 percent by weight in the sintering process.

Preferably, the sintering temperature is not more than 1700° C.

Preferably, the mean grain size of the powder of aluminum nitride is at least 0.5 μm and not more than 2.0 μm.

Preferably, the content of oxygen in the powder of aluminum nitride is at least 0.8 percent by weight and not more than 1.5 percent by weight with respect to the weight of the aluminum nitride powder.

According to the present invention, an aluminum nitride sintered body having stable strength can be obtained by low-temperature sintering employing a sintering aid containing a rare earth element and an alkaline earth metal element, by strictly controlling the amount of the sintering aid and controlling the amount of carbon remaining in the sintered body thereby suppressing grain growth while maintaining excellent basic properties such as high thermal conductivity.

In general, an oxide present in a sintered body reacts with a rare earth element or an alkaline earth metal element blended as a sintering aid to form a rare earth aluminum oxide or an alkaline earth aluminum oxide and form liquid phases on grain boundaries to facilitate sintering. According to the inventors' studies, however, it has been proved that liquid phases are formed in excess if no proper amount of carbon is present to activate mass transfer therethrough, and hence the grain sizes of the sintered body unnecessarily increase as a result.

The present invention has been proposed on the basis of such new recognition that the amount of carbon remaining in the aforementioned aluminum nitride sintered body is closely related to the grain sizes and strength of the sintered body. In other words, low-temperature sintering through liquid phases is enabled while the grain sizes of the sintered body can be suppressed in a desired range by adding carbon to the sintered body to remain therein in a prescribed amount.

According to the present invention, the amount of carbon is controlled to remain in the aluminum nitride sintered body by 0.005 to 0.1 percent by weight, while the contents of the alkaline earth metal element and the rare earth element compound derived from the sintering aid are set to 0.01 to 5 percent by weight and 0.01 to 10 percent by weight in terms of oxides thereof respectively. Thus, the strength of the sintered body can be improved by suppressing grain growth not to increase the grain sizes.

If the amount of carbon remaining in the aluminum nitride sintered body is less than 0.005 percent by weight, oxides cannot be sufficiently reduced due to the insufficient amount of carbon present in sintering. Thus, grain growth of the aluminum nitride sintered body is caused beyond necessity to increase the number of coarse grains, resulting in reduction of the strength of the sintered body. If carbon remains in excess of 0.1 percent by weight, such excess carbon causes deficiency of oxides in the sintered body. Thus, sintering insufficiently progresses under a low temperature of not more than 1700° C. In certain examples according to the invention, the remaining carbon content in the sintered body is less than 0.05 percent by weight.

The contents of the alkaline earth metal element and the rare earth element are set in the aforementioned ranges since the density of the sintered body is lowered in low-temperature sintering under a temperature of not more than 1700° C. due to deficiency of the sintering aid if the contents of the elements are less than the lower limits of the aforementioned ranges, leading to inferior quality of the sintered body. If the contents of the elements exceed the upper limits of the aforementioned ranges, excess alkaline earth aluminum oxide, rare earth aluminum oxide and alkaline earth rare earth aluminum oxide are deposited on the grain boundaries of the aluminum nitride sintered body, to deteriorate the thermal conductivity.

The alkaline earth metal element preferably includes at least one element selected from a group consisting of Ca, Sr and Ba. The rare earth element preferably includes at least one element selected from a group consisting of Y, La, Ce, Sc, Yb, Nd, Er and Sm. An aluminum nitride sintered body particularly excellent in thermal conductivity and other characteristics can be obtained by employing such alkaline earth metal element and rare earth element.

In the aluminum nitride sintered body, grain growth is suppressed due to reduction of the oxides with carbon as described above, whereby the mean grain size of the sintered body is reduced. In particular, the mean grain size of the sintered body is preferably not more than 3 $\mu$m, and more preferably not more than 2 $\mu$m. If the mean grain size exceeds 3 $\mu$m, the strength and thermal shock resistance of the aluminum nitride sintered body may be so lowered that the aluminum nitride sintered body is unsuitable for application to a radiating substrate for a power module or a jig for semiconductor equipment employed under a particularly strict heat cycle.

The method of preparing an aluminum nitride sintered body according to the present invention is now described. In this method, mixed powder is first prepared by adding an alkaline earth metal element and a rare earth element to aluminum nitride powder as a sintering aid, by at least 0.01 percent by weight and not more than 5 percent by weight and at least 0.01 percent by weight and not more than 10 percent by weight in terms of oxides thereof respectively and further adding carbon or a compound liberating carbon. A compact is prepared from this mixed powder, and this compact is sintered. Thus, an aluminum nitride sintered body containing carbon is obtained.

Alternatively, mixed powder is prepared by adding a sintering aid to aluminum nitride powder in the aforementioned ratios. A compact is prepared from this mixed powder, and this compact is sintered in an atmosphere containing carbon monoxide gas or hydrocarbon gas. Thus, an aluminum nitride sintered body containing carbon is obtained.

The inventive method may be carried out through any of three methods depending on the means of leaving carbon in the obtained aluminum nitride sintered body. In the first method, carbon powder is added in the form of carbon black, coke powder, graphite powder or diamond powder to unsintered material powder of aluminum nitride powder and a sintering aid. The carbon powder must be added by 0.01 to 2 percent by weight. If the amount of the carbon powder is out of this range, it is difficult to control the amount of carbon remaining in the sintered body to 0.005 to 0.1 percent by weight and to improve the strength of the sintered body by suppressing increase of the grain sizes. In certain examples according to the invention, the carbon content in the starting material is more than 0.008 percent by weight and less than 0.05 percent by weight.

In the second method, a compound liberating carbon is employed when sintering aluminum nitride, in place of the aforementioned carbon powder. More specifically, at least one compound is preferably selected from a group consisting of polyacrylonitrile, polyvinyl alcohol, polyvinyl butyral, polyethylene terephthalate, glucose, fructose, saccharose, phenol-formaldehyde resin and stearic acid. With such a compound, which can be dissolved in an organic solvent or water to be thereafter added to/mixed with aluminum nitride powder, carbon can be more homogeneously dispersed in the sintered body as compared with the aforementioned method adding carbon powder. Stearic acid can be added in the form of rare earth salt, as a rare earth element compound forming the sintering aid.

In the second method employing the compound liberating carbon, the compact is heated in a non-oxidizing atmosphere at a temperature of 150 to 1500° C., so that carbon is liberated from the compound to contribute to reduction of oxides. The amount of the compound liberating carbon may be in the range of 0.01 to 20 percent by weight, to obtain an effect similar to that in the aforementioned case of directly adding carbon powder.

In the third method, a compact prepared from mixed powder of aluminum nitride powder and a sintering aid is sintered in a non-oxidizing atmosphere containing at least 10 percent by volume of gas selected from carbon monoxide gas and hydrocarbon gas. In this case, oxides in the sintered body can be reduced in a shorter time than those in the first and second methods, due to high reactivity of the gas. According to this method, further, the optimum amount of carbon can be readily left in the sintered body by controlling the composition of the gas in the aforementioned range.

The inventors have observed and studied the sintering process in the inventive method in detail, to find that an aluminum nitride sintered body particularly excellent in strength and the like can be obtained when the amount of carbon contained in the compact or the sintered body at 1500° C. in the sintering process is 0.01 to 0.1 percent by weight. If the amount of carbon is less than 0.01 percent by weight in the stage of starting sintering at the temperature of 1500° C., the amount of carbon finally remaining in the sintered body is less than 0.005 percent by weight since carbon is further consumed in the later step of reducing oxides. If the amount of carbon is in excess of 0.1 percent by weight in this stage, carbon remains in the grain boundaries of the sintered body to irregularize the color due to heterogeneous transmittance, or sintering incompletely progresses to result in defective sintering density. Therefore, the amount of the remaining carbon at 1500° C. must be controlled by setting the speed for increasing the temperature at 1° C./min. in the temperature range of 1300 to 1500° C. or holding the compact in this temperature range for 1 to 10 hours to sufficiently progress the reaction of $Al_2O_3+3C+N_2 \rightarrow 2AlN+3CO$.

In the aforementioned method according to the present invention, the sintering temperature for aluminum nitride is preferably not more than 1700° C. If the sintering temperature exceeds 1700° C., grain growth takes place beyond necessity in the aluminum nitride sintered body even if addition of carbon or the like is so controlled that the amount of carbon remaining in the aluminum nitride sintered body is 0.005 to 0.1 percent by weight. Consequently, the mean grain size of the sintered body exceeds 3 sum to lower the strength of the sintered body.

The mean grain size ($d_{50}$) of the employed aluminum nitride powder is preferably in the range of at least 0.5 $\mu$m and not more than 2.0 $\mu$m. The term "mean grain size ($d_{50}$)" stands for that grain size having the highest appearance frequency among grain sizes. If the mean grain size exceeds 2.0 $\mu$m, it is difficult to obtain a sintered body having fine grains of not more than 3 $\mu$m in grain size in particular, due to the excessive initial grain sizes. If the mean grain size of the aluminum nitride powder is less than 0.5 $\mu$m, bulk density in powder molding is so increased that it is difficult to increase molding density, and hence the strength of the compact is lowered.

Further, the amount of oxygen contained in the aluminum nitride powder is preferably in the range of at least 0.8 percent by weight and not more than 1.5 percent by weight. If the oxygen content is less than 0.8 percent by weight, the amount of liquid phases formed between oxides and the sintering aid in sintering tends to be insufficient, to lower the sinterability. If the oxygen content exceeds 1.5 percent by weight, the amount of the liquid phases, i.e., grain boundary phases is increased to readily excessively cause grain growth during sintering.

In particular, it has been proved that the adhesion strength of the conductive layer or the insulating layer formed by the thick film paste method is improved in the aluminum nitride sintered body according to the present invention. The first reason for this is that the mean grain size of the sintered body is reduced, particularly to not more than 3 $\mu$m, and the second reason is that the wettability of the aluminum nitride grains is improved due to the residual carbon.

The alkaline earth metal element and the rare earth element forming the sintering aid have an effect of improving adhesion between the aluminum nitride grains or adhesion between the aluminum nitride grains and the insulating layer or the conductive layer formed thereon. Compounds of the alkaline earth metal element and the rare earth element are generally present in the vicinity of the grain boundary phases of the aluminum nitride grains in the sintered body. Observing the adhesion strength with respect to the conductive layer or the insulating layer in a microscopic point of view, adhesion between the aluminum nitride grains and the insulating layer or the conductive layer is high in portions where the grain boundary phases of the aluminum nitride grains which are bonded to each other through the sintering aid, and the conductive layer are in contact with each other. In portions where the aluminum nitride grains are directly in contact with the insulating layer, however, adhesion is conceivably low. Particularly when the mean grain size is greater than 3 $\mu$m, coarse grains of aluminum nitride are present in the sintered body to result in sparse distribution of grain boundary phases having high adhesion. Therefore, portions having insufficient adhesion strength tend to arise to readily cause peeling when tensile stress is applied between the aluminum nitride sintered body and the conductive layer or the insulating layer in measurement of peel strength or the like, to result in reduction of the adhesion strength.

According to the present invention, the mean grain size of the aluminum nitride sintered body can be controlled to be small, preferably to not more than 3 $\mu$m, as the aforementioned first reason. Thus, compounds of the alkaline earth metal element and the rare earth element are homogeneously distributed on the grain boundaries of such small grains over a wide range with no partial segregation, to further improve the adhesion strength between the aluminum nitride grains and the conductive layer or the insulating layer.

In addition to such distribution of the compounds around the grain boundaries, carbon remaining in the aluminum nitride sintered body reforms the surfaces of the aluminum nitride grains and improves the wettability with respect to the conductive layer or the insulating layer. In particular, the wettability between the metal components and the insulating layer is improved to attain further improvement of the adhesion strength. If the amount of carbon is excessive, however, the sinterability is reduced. Therefore, the amount of carbon remaining in the sintered body is preferably in the range of at least 0.005 percent by weight and not more than 0.1 percent by weight. Or more narrowly defined as stated above.

Paste employed for the thick film paste method may be any paste generally employed for forming a conductive layer or an insulating layer, such as Ag, Ag paste such as Ag-Pt or Ag-Pd paste, conductive paste such as Cu paste or Au paste, resistive paste of $RuO_2$, Ru or $Bi_2Ru_2O_7$, dielectric paste mainly composed of lead borosilicate glass or the like, or high melting point paste of W, Mo, TiN or ZrN.

In order to form the conductive layer or the insulating layer, a thick film layer may be formed by screen-printing the paste on the surface of the aluminum nitride sintered body and heating the same at a prescribed temperature. Alternatively, high melting point paste of W, Mo, TiN or ZrN may be applied to the surface of the unsintered compact to be fired simultaneously with sintering of the compact, to form the conductive layer or the insulating layer.

The foregoing and other objects, features, aspects and advantages of the present invention will become more apparent from the following detailed description of the present invention.

DESCRIPTION OF THE PREFERRED EMBODIMENTS

EXAMPLE 1

Samples of mixed powder of 100 percent by weight in total were prepared by adding aluminum nitride powder (mean grain size: 1.8 $\mu$m, oxygen content with respect to aluminum nitride: 1.4 percent by weight) obtained by direct nitriding to carbon black (BET value (surface area per unit mass calculated by BET adsorption isotherm): 500 $m^2/g$), employed as carbon powder, in amounts shown in Table 1, 1 percent by weight of calcium oxide and 6 percent by weight of yttrium oxide. Polymethyl methacrylate for serving as a binder, a mixture of dibutyl phthalate and benzyl butyl phthalate for serving as a plasticizer and a mixture of methyl ethyl ketone and toluene for serving as a solvent were added to each sample of the mixed powder and mixed in a ball mill, to prepare a slurry.

The obtained slurry was defoamed, and a green sheet of aluminum nitride was formed as a compact by a doctor blade coater. Paste mainly composed of tungsten powder having a mean grain size of 1 $\mu$m and containing 5 percent by weight of $SiO_2$ frit was applied to a surface of the green sheet, and degassed. Thereafter the green sheet was fired in a nitrogen atmosphere at a temperature of 1700° C. for five hours, thereby baling the paste and simultaneously sintering aluminum nitride. Part of each sample was taken out in a stage of 1500° C. in temperature in the sintering process, to measure the carbon content in this stage.

Thus, a tungsten metallized layer of 10 $\mu$m in thickness was formed on the overall single surface of an aluminum nitride sintered body of 25 mm by 25 mm having a thickness of 0.635 mm. Ni-P plating was performed on the tungsten metallized layer of each sample, which in turn was held in a nitrogen atmosphere at a temperature of 600° C. for 30 minutes to sinter the plating layer. No abnormality such as blistering or peeling was observed on the metallized layer and the plating layer. The thickness of every plating layer was in the range of 6±0.3 $\mu$m.

An electrolytic copper material of JIS nominal C 1020, identical in length and width to the aluminum nitride sintered body, having a thickness of 1 mm was placed on each sample, and the sample was arranged on a setter in a furnace and subjected to furnace bonding in a nitrogen atmosphere at a temperature of 970° C. for 30 minutes with no load. Ten test pieces for each sample prepared in the aforementioned manner were subjected to a test of repeating a cycle of holding the test pieces at a temperature of 0° C. for 15 minutes and thereafter holding the same at a temperature of 100° C. for 15 minutes 100 times. Strength values of the sintered bodies were relatively compared with each other through ratios (number of cracked test pieces/10) of cracked aluminum nitride sintered bodies resulting from the cycle test. Samples of aluminum nitride sintered bodies having no conductive layers were prepared in a similar manner to the above, and subjected to evaluation of the mean grain size, relative density and thermal conductivity. Table 1 shows the results.

TABLE 1

| Sample | Amount of Carbon Powder (wt. %) | Carbon Content at 1500° C. (wt. %) | Carbon Content in Sintered Body (wt. %) | Cracking | Characteristics of AlN Sintered Body | | |
|---|---|---|---|---|---|---|---|
| | | | | | Mean Grain Size ($\mu$m) | Relative Density (%) | Thermal Conductivity (W/mK) |
| 1 | 0.008 | 0.007 | 0.004 | 7/10 | 3.5 | 100 | 100 |
| 2 | 0.013 | 0.011 | 0.007 | 2/10 | 2.9 | 100 | 150 |
| 3 | 0.03 | 0.03 | 0.02 | 1/10 | 2.8 | 100 | 160 |
| 4 | 0.1 | 0.07 | 0.06 | 0/10 | 2.7 | 100 | 160 |
| 5 | 0.3 | 0.08 | 0.07 | 0/10 | 2.5 | 100 | 165 |
| 6 | 1.0 | 0.09 | 0.08 | 0/10 | 1.8 | 99 | 170 |
| 7 | 1.9 | 0.095 | 0.09 | 0/10 | 1.7 | 99 | 170 |
| 8 | 3.0 | 0.30 | 0.20 | 8/10 | 1.5 | 95 | 160 |

As understood from the above results, crystal grains grow in the sintered body due to insufficient reduction of oxides in sintering if the amount of carbon black is less than 0.01 percent by weight, to lower the strength of the sintered body and cause cracking resulting from thermal shock. If the amount of carbon black exceeds 2 percent by weight, sintering is hindered and the density of the sintered body is lowered, leading to a tendency of causing a large number of cracks. It is also understood that the carbon content at the temperature of 1500° C. in the sintering process is preferably in the range of at least 0.01 percent by weight and not more than 0.1 percent by weight.

EXAMPLE 2

Samples Nos. 1 to 8 were prepared by providing tungsten metallized layers and Ni-P plating layers on aluminum nitride sintered bodies, similarly to Example 1. A metal layer of 0.2 mm in thickness and 5.0 mm in width was bonded onto the Ni-P plating layer of each sample so that the bonding length was 3 mm, and a grip part of the metal layer perpendicularly projected upward from an end of the bonded portion was pulled upward at a speed of 20 mm/min., for measuring peel strength of a conductive layer formed by metallization. Table 2 shows the results.

TABLE 2

| Sample | Peel Strength (kg/mm) |
|---|---|
| 1 | 1.3~2.0 |
| 2 | 1.8~2.5 |
| 3 | 2.0~2.3 |
| 4 | 2.3~2.6 |
| 5 | 2.4~2.6 |
| 6 | 2.5~2.8 |
| 7 | 2.4~2.6 |
| 8 | 1.5~1.7 |

As understood from the above results, grain growth in the sintered body was suppressed and compounds of the alkaline earth metal element and the rare earth element were homogeneously distributed while wettability between the aluminum nitride grains and the metals were improved due to the presence of carbon in each of the samples Nos. 2 to 7 having the amount of carbon black in the range of at least 0.01 percent by weight and not more than 2 percent by weight, whereby the adhesion strength of the conductive layer was improved.

In the sample No. 1 containing the carbon black in the amount of less than 0.01 percent by weight, however, compounds of the alkaline earth metal element and the rare earth element were segregated due to grain growth, to cause portions having insufficient metallization strength in a microscopic point of view. Further, the wettability between the metals and the aluminum nitride grains was lowered due to reduction of the carbon content in the sintered body. Thus, the peel strength of the sample No. 1 was lowered. In the sample No. 8 containing the carbon black in the amount exceeding 2 percent by weight, the sinterability was inhibited to lower the strength of the sintered body. Thus, cracking was caused inside the aluminum nitride sintered body as determined by a result of peel strength evaluation, to lower the measured value.

EXAMPLE 3

Samples of mixed powder of 100 percent by weight in total were prepared by adding aluminum nitride powder (mean grain size: 0.8 $\mu$m, oxygen content: 1.0 percent by weight) obtained by reduction nitriding to polyvinyl butyral (PVB), employed as a compound liberating carbon, in amounts shown in Table 3, 1.13 percent by weight of calcium carbonate in terms of an oxide and 3 percent by weight of neodymium oxide. A green sheet was prepared as a compact from each sample by a method similar to that in Example 1, and thereafter tungsten paste was printed on the green sheet similarly to Example 1. The compact was heat-treated in a nitrogen atmosphere at a temperature of 1000° C. for 10 hours thereby liberating carbon, and thereafter fired at a temperature of 1650° C. for five hours thereby forming an aluminum nitride sintered body of 25 mm by 25 mm having a thickness of 0.635 mm, formed with a tungsten metallized layer of 10 $\mu$m in thickness on its surface.

An Ni-P plating layer was formed on the tungsten metallized layer of each sample similarly to Example 1, and thereafter the sample was subjected to evaluation similar to that in Example 1. Aluminum nitride sintered bodies having no such metallized layers and plating layers were similarly prepared and subjected to evaluation similar to that in Example 1. Table 3 shows the results.

TABLE 3

| Sample | Amount of PVB (wt. %) | Carbon Content at 1500° C. (wt. %) | Carbon Content in Sintered Body (wt. %) | Cracking | Characteristics of AlN Sintered Body ||| 
|---|---|---|---|---|---|---|---|
| | | | | | Mean Grain Size ($\mu$m) | Relative Density (%) | Thermal Conductivity (W/mK) |
| 9  | 0.004 | 0.007 | 0.004 | 6/10 | 3.2 | 100 | 90 |
| 10 | 0.013 | 0.011 | 0.007 | 2/10 | 2.8 | 100 | 140 |
| 11 | 0.040 | 0.030 | 0.021 | 1/10 | 2.6 | 100 | 150 |
| 12 | 0.15  | 0.059 | 0.044 | 1/10 | 2.5 | 100 | 152 |
| 13 | 0.50  | 0.065 | 0.051 | 0/10 | 2.4 | 99  | 158 |
| 14 | 2.0   | 0.071 | 0.063 | 0/10 | 2.3 | 99  | 162 |
| 15 | 6.0   | 0.080 | 0.071 | 1/10 | 2.2 | 99  | 164 |
| 16 | 10.0  | 0.089 | 0.081 | 1/10 | 1.9 | 99  | 166 |
| 17 | 18.0  | 0.095 | 0.092 | 2/10 | 1.8 | 99  | 170 |
| 18 | 25.0  | 0.30  | 0.15  | 7/10 | 1.5 | 96  | 150 |

It is understood from the above results that an aluminum nitride sintered body having excellent strength can be obtained even if employing polyvinyl butyral, calcium carbonate and neodymium oxide as a carbon source, an alkaline earth metal element compound and a rare earth element compound respectively, by controlling the amounts thereof so that carbon remains in the aluminum nitride sintered body in the range of at least 0.005 percent by weight and not more than 0.10 percent by weight, similarly to Example 1.

Thus, a tungsten metallized layer of 10 $\mu$m in thickness was formed on the overall single surface of each aluminum nitride sintered body of 25 mm by 25 mm having a thickness of 0.635 mm. Thereafter an Ni-P plating layer was formed on the tungsten metallized layer similarly to Example 1, and subjected to evaluation similar to that in Example 1. Aluminum nitride sintered bodies formed with no such metallized layers and plating layers were similarly prepared and evaluated similarly to Example 1. Table 4 shows the results.

TABLE 4

| Sample | Atmosphere in Sintering (vol. %) | Carbon Content in Sintered Body (wt. %) | Cracking | Characteristics of AlN Sintered Body ||| 
|---|---|---|---|---|---|---|
| | | | | Mean Grain Size ($\mu$m) | Relative Density (%) | Thermal Conductivity (W/mK) |
| 19 | nitrogen (100)            | 0.001 | 8/10 | 3.7 | 100 | 85  |
| 20 | methane(5) + nitrogen(95) | 0.003 | 3/10 | 3.3 | 100 | 110 |
| 21 | butane(15) + ammonia(85)  | 0.007 | 1/10 | 2.8 | 100 | 120 |
| 22 | acetylene (30) + nitrogen(70) | 0.01 | 0/10 | 2.5 | 100 | 120 |
| 23 | butane(50) + nitrogen(50) | 0.02 | 0/10 | 2.3 | 100 | 140 |
| 24 | acetylene (60) + nitrogen(40) | 0.04 | 0/10 | 2.4 | 100 | 130 |
| 25 | methane(80) + ammonia(20) | 0.06 | 0/10 | 1.9 | 100 | 140 |
| 26 | butane(100)               | 0.08 | 0/10 | 1.8 | 100 | 130 |

EXAMPLE 4

Samples of mixed powder of 100 percent by weight in total were prepared by adding aluminum nitride powder (mean grain size: 1.5 $\mu$m, oxygen content with respect to the weight of aluminum nitride powder: 1.2 percent by weight) obtained by reduction nitriding to 3.14 percent by weight of barium carbonate in terms of an oxide and 8 percent by weight of neodymium oxide. Green sheets were prepared as compacts from these samples of mixed powder by a doctor blade coater, similarly to Example 1. Paste mainly composed of tungsten powder of 1 $\mu$m in mean grain size and containing 5 percent by weight of SiO$_2$ frit was applied to each green sheet and degassed, and thereafter the green sheet was fired in an atmosphere shown in Table 4 at a temperature of 1600° C. for six hours, to bake the paste and simultaneously sinter aluminum nitride.

It is understood from the above results that the amount of carbon remaining in the sintered body can be controlled through the amount of hydrocarbon contained in the firing atmosphere and the amount of carbon contained in the sintered body can be controlled to at least 0.005 percent by weight and not more than 0.10 percent by weight by sintering the compact in the atmosphere containing at least 10 percent by weight of hydrocarbon gas for obtaining an aluminum nitride sintered body having excellent strength.

EXAMPLE 5

Samples of aluminum nitride sintered bodies were prepared by a method similar to that for the sample No. 15 of Example 3 while setting only the mean grain sizes of employed aluminum nitride powder as shown in Table 5, and subjected to evaluation similar to that in Example 3. Table 5 shows the results.

TABLE 5

| Sample | Mean Grain Size of AlN Powder (μm) | Carbon Content at 1500° C. (wt. %) | Carbon Content in Sintered Body (wt. %) | Cracking | Characteristic of AlN Sintered Body ||| 
|---|---|---|---|---|---|---|---|
| | | | | | Mean Grain Size (μm) | Relative Density (%) | Thermal Conductivity (W/mK) |
| 27 | 0.4 | compact cracked and unsintered |||||||
| 28 | 0.6 | 0.13 | 0.11 | 4/10 | 1.9 | 97 | 140 |
| 15 | 0.8 | 0.080 | 0.071 | 1/10 | 2.2 | 99 | 164 |
| 29 | 1.3 | 0.072 | 0.042 | 1/10 | 2.6 | 99 | 160 |
| 30 | 1.8 | 0.044 | 0.030 | 1/10 | 2.8 | 100 | 152 |
| 31 | 2.4 | 0.022 | 0.015 | 5/10 | 3.5 | 100 | 130 |

Note:
Sample No. 15 is identical to sample No. 15 in Example 3.

It is understood from the above results that the binder enters small clearances between the aluminum nitride grains to lower the strength of the compact or degreasing is made so difficult that excess carbon remains in the sintered body to lower sinterability if the mean grain size of the material aluminum nitride powder is less than 0.8 μm. If the mean grain size of the aluminum nitride powder exceeds 2 μm, the mean grain size of the sintered body exceeds 3 μm to lower the strength of the sintered body as a result.

EXAMPLE 6

Samples of aluminum nitride sintered bodies were prepared by a method similar to that for the sample No. 26 of Example 4 while setting only the oxygen contents in the aluminum nitride powder as shown in Table 6, and subjected to evaluation similar to that in Example 4. Table 6 shows the results.

TABLE 6

| Sample | Oxygen Content in AlN Powder (wt. %) | Carbon Content in Sintered Body (wt. %) | Cracking | Characteristics of AlN Sintered Body |||
|---|---|---|---|---|---|---|
| | | | | Mean Grain Size (μm) | Relative Density (%) | Thermal Conductivity (W/mK) |
| 32 | 0.5 | 0.09 | 5/10 | 1.7 | 95 | 110 |
| 33 | 0.8 | 0.08 | 0/10 | 1.8 | 100 | 133 |
| 26 | 1.2 | 0.08 | 0/10 | 1.8 | 100 | 130 |
| 34 | 1.5 | 0.04 | 1/10 | 2.9 | 100 | 122 |
| 35 | 2.0 | 0.03 | 6/10 | 3.3 | 100 | 120 |

Note:
Sample No. 26 is identical to sample No. 26 in Example 4.

It is understood from the above results that the strength of the sintered body may be deteriorated due to reduction of the sinterability if the oxygen content in the aluminum nitride powder is less than 0.8 percent by weight, while the oxygen content cannot be controlled but the mean grain size of the sintered body is increased if the oxygen content is in excess of 1.5 percent by weight. Thus, the strength of the sintered body may be reduced also in this case.

EXAMPLE 7

Samples of aluminum nitride sintered bodies were prepared by a method similar to that for the sample No. 3 of Example 1 while setting only the sintering temperatures as shown in Table 7, and subjected to evaluation similar to that in Example 1. Table 7 shows the results.

TABLE 7

| Sample | Sintering Temperature (° C.) | Carbon Content at 1500° C. (wt. %) | Carbon Content in Sintered Body (wt. %) | Cracking | Characteristics of AlN Sintered Body |||
|---|---|---|---|---|---|---|---|
| | | | | | Mean Grain Size (μm) | Relative Density (%) | Thermal Conductivity (W/mK) |
| 36 | 1600 | 0.03 | 0.02 | 2/10 | 1.9 | 99 | 120 |
| 37 | 1650 | 0.03 | 0.02 | 2/10 | 2.3 | 100 | 150 |
| 3 | 1700 | 0.03 | 0.02 | 1/10 | 2.8 | 100 | 160 |
| 38 | 1750 | 0.03 | 0.02 | 7/10 | 3.7 | 100 | 180 |
| 39 | 1800 | 0.03 | 0.02 | 8/10 | 4.0 | 100 | 200 |

Note:
Sample No. 3 is identical to sample No. 3 in Example 1.

It is understood from the above results that the mean grain size of the sintered body exceeds 3 μm if the sintering temperature exceeds 1700° C. and hence the strength of the sintered body is lowered to increase the ratio of cracking in the heat cycle evaluation described with reference to Example 1 as a result.

EXAMPLE 8

Samples of aluminum nitride sintered bodies were prepared by a method similar to that in Example 1 while setting the contents of yttrium oxide and calcium oxide remaining in the sintered bodies as shown in Table 8, and subjected to evaluation similar to that in Example 1. Table 8 shows the results.

TABLE 8

| | Content | | | Carbon Content in | | Characteristics of AlN Sintered Body | | |
|---|---|---|---|---|---|---|---|---|
| Sample | $Y_2O_3$ (wt. %) | CaO (wt. %) | Carbon Powder (wt. %) | Sintered Body (wt. %) | Cracking | Mean Grain Size (μm) | Relative Density (%) | Thermal Conductivity (W/mK) |
| 1 | 0.005 | 1.0 | 0.1 | 0.06 | 9/10 | 1.6 | 85.0 | 80 |
| 2 | 0.05 | 1.0 | 0.1 | 0.06 | 1/10 | 2.4 | 99.0 | 152 |
| 3 | 1 | 1.0 | 0.1 | 0.06 | 0/10 | 2.6 | 100.0 | 167 |
| 4 | 6 | 1.0 | 0.1 | 0.06 | 0/10 | 2.7 | 100.0 | 160 |
| 5 | 9 | 1.0 | 0.1 | 0.06 | 0/10 | 2.4 | 99.4 | 165 |
| 6 | 12 | 1.0 | 0.1 | 0.06 | 2/10 | 2.3 | 99.0 | 110 |
| 7 | 3 | 0.005 | 0.1 | 0.06 | 10/10 | 1.1 | 80.0 | 75 |
| 8 | 3 | 0.05 | 0.1 | 0.06 | 1/10 | 2.3 | 99.0 | 154 |
| 10 | 3 | 1.0 | 0.1 | 0.06 | 0/10 | 2.6 | 100.0 | 169 |
| 11 | 3 | 3.0 | 0.1 | 0.06 | 0/10 | 2.5 | 99.7 | 157 |
| 12 | 3 | 7.0 | 0.1 | 0.06 | 6/10 | 2.0 | 97.6 | 98 |

Note:
Sample No. 4 is identical to sample No. 4 in Example 1.

It is understood from Table 8 that preferable characteristics can be obtained if the content of $Y_2O_3$ is at least 0.01 percent by weight and not more than 10 percent by weight and the content of CaO is at least 0.01 percent by weight and not more than 5 percent by weight.

According to the present invention, as clearly understood from the aforementioned Examples, an aluminum nitride sintered body excellent in thermal shock resistance and strength and improved in adhesion strength to a conductive layer or an insulating layer formed by a thick film paste method can be provided by controlling the amount of carbon thereby suppressing grain growth when sintering aluminum nitride with a sintering aid containing a rare earth element and an alkaline earth metal element. Thus, the aluminum nitride sintered body according to the present invention is applicable to a radiating substrate for a power module or a jig for semiconductor equipment used under a strict heat cycle.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. An article comprising a sintered body that is formed by sintering a starting material, and that contains:
  at least 0.01 percent by weight and not more than 5 percent by weight of an alkaline earth metal element in terms of an oxide thereof,
  at least 0.01 percent by weight and not more than 10 percent by weight of a rare earth element in terms of an oxide thereof,
  at least 0.005 percent by weight and less than 0.05 percent by weight of residual carbon, resulting from more than 0.008 percent by weight and less than 0.05 percent by weight of carbon being contained in said starting material, and
  a remainder,
  wherein a main component of said remainder is aluminum nitride, and
  wherein said sintered body has a structure formed of grains having a mean grain size of not more than 3μm.
2. The article in accordance with claim 1, wherein said alkaline earth metal element includes at least one element selected from a group consisting of Ca, Sr and Ba.
3. The article in accordance with claim 1, wherein said rare earth element includes at least one element selected from a group consisting of Y, La, Ce, Sc, Yb, Nd, Er and Sm.
4. The article in accordance with claim 1, further comprising a conductive layer or an insulating layer formed on a surface of said sintered body by a thick film paste method.
5. The article according to claim 1, wherein the content of said residual carbon in said sintered body is at least 0.007 percent by weight and not more than 0.021 percent by weight.
6. The article according to claim 1, wherein said remainder essentially consists of said aluminum nitride.
7. The article according to claim 1, wherein said mean grain size is not more than 2 μm.
8. A method of preparing the article according to claim 1, comprising steps of:
  preparing a mixed powder containing more than 0.008 percent by weight and less than 0.05 percent by weight of carbon powder, at least 0.01 percent by weight and not more than 5 percent by weight of an alkaline earth metal element in terms of an oxide thereof, at least 0.01 percent by weight and not more than 10 percent by weight of a rare earth element in terms of an oxide thereof, and a remainder mainly composed of a powder of aluminum nitride;
  forming a compact with said mixed powder; and
  forming said sintered body by sintering said compact.
9. The method in accordance with claim 8, wherein said compact has a content of carbon at a temperature of 1500° C. that is at least 0.01 percent by weight and less than 0.05 percent by weight during said sintering.

10. The method in accordance with claim 8, wherein said sintering is carried out at a sintering temperature of not more than 1700° C.

11. The method in accordance with claim 8, wherein said powder of aluminum nitride has a grain size of at least 0.5 μm and not more than 2.0 μm.

12. The method in accordance with claim 8, wherein said powder of aluminum nitride has a content of oxygen of at least 0.8 percent by weight and not more than 1.5 percent by weight with respect to a total weight of said powder of aluminum nitride.

13. A method of preparing the article according to claim 1, comprising steps of:

preparing a mixed powder containing at least 0.01 percent by weight and not more than 20 percent by weight of a compound liberating carbon, at least 0.01 percent by weight and not more than 5 percent by weight of an alkaline earth metal element in terms of an oxide thereof, at least 0.01 percent by weight and not more than 10 percent by weight of a rare earth element in terms of an oxide thereof, and a remainder mainly composed of a powder of aluminum nitride;

forming a compact with said mixed powder;

liberating carbon by heat-treating said compact in a non-oxidizing atmosphere at a heat-treating temperature of at least 150° C. and not more than 1500° C.; and forming said sintered body by sintering said compact after said heat-treating.

14. The method in accordance with claim 13, wherein said compound liberating carbon includes at least one compound selected from a group consisting of polyacrylonitrile, polyvinyl alcohol, polyvinyl butyral, polyethylene terephthalate, glucose, fructose, saccharose, phenol-formaldehyde resin and stearic acid.

15. The method in accordance with claim 13, wherein said compact has a content of carbon at a temperature of 1500° C. that is at least 0.01 percent by weight and less than 0.05 percent by weight during said sintering.

16. The method in accordance with claim 13, wherein said sintering is carried out at a sintering temperature of not more than 1700° C.

17. The method in accordance with claim 13, wherein said powder of aluminum nitride has a mean grain size of at least 0.5 μm and not more than 2.0 μm.

18. The method in accordance with claim 13, wherein said powder of aluminum nitride has a content of oxygen of at least 0.8 percent by weight and not more than 1.5 percent by weight with respect to a total weight of said powder of aluminum nitride.

* * * * *

UNITED STATES PATENT AND TRADEMARK OFFICE
CERTIFICATE OF CORRECTION

PATENT NO.    : 6,271,163 B1
DATED         : August 7, 2001
INVENTOR(S)   : Yushio et al.

It is certified that error appears in the above-identified patent and that said Letters Patent is hereby corrected as shown below:

Column 1,
Line 25, after "body,", delete "to".
Line 27, after "nitride", insert -- , --.

Column 7,
Line 32, after "grains", insert -- , --;
Line 64, after "weight", replace ". Or" by -- , or --.

Column 8,
Line 43, after "thereby", replace "baling" by -- baking --.

Signed and Sealed this

Fifteenth Day of January, 2002

Attest:

Attesting Officer

JAMES E. ROGAN
Director of the United States Patent and Trademark Office